(12) United States Patent
Yang et al.

(10) Patent No.: US 10,714,634 B2
(45) Date of Patent: Jul. 14, 2020

(54) NON-VOLATILE SPLIT GATE MEMORY CELLS WITH INTEGRATED HIGH K METAL CONTROL GATES AND METHOD OF MAKING SAME

(71) Applicant: Silicon Storage Technology, Inc., San Jose, CA (US)

(72) Inventors: Jeng-Wei Yang, Zhubei (TW); Man-Tang Wu, Hsinchu County (TW); Chun-Ming Chen, New Taipei (TW); Chien-Sheng Su, Saratoga, CA (US); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 16/166,342

(22) Filed: Oct. 22, 2018

(65) Prior Publication Data

US 2019/0172942 A1 Jun. 6, 2019

Related U.S. Application Data

(60) Provisional application No. 62/594,976, filed on Dec. 5, 2017.

(51) Int. Cl.
*H01L 29/788* (2006.01)
*H01L 27/11521* (2017.01)
(Continued)

(52) U.S. Cl.
CPC ...... *H01L 29/788* (2013.01); *H01L 27/11521* (2013.01); *H01L 27/11524* (2013.01);
(Continued)

(58) Field of Classification Search
CPC ......... H01L 27/11521; H01L 27/11524; H01L 27/11529; H01L 27/11534;
(Continued)

(56) References Cited

U.S. PATENT DOCUMENTS

| 5,242,848 A | 9/1993 | Yeh |
|---|---|---|
| 6,747,310 B2 | 6/2004 | Fan et al. |

(Continued)

FOREIGN PATENT DOCUMENTS

| TW | 200723543 | 6/2007 |
|---|---|---|
| TW | 201338101 | 9/2013 |

OTHER PUBLICATIONS

Chen, et al., "Metal Floating Gate Memory Device With SiO$_2$/HfO$_2$ Dual-Layer as Engineered Tunneling Barrier," IEEE Electron Device Letters, vol. 35, No. 7, pp. 744-746, Jul. 2014.
(Continued)

*Primary Examiner* — Allan R Wilson
(74) *Attorney, Agent, or Firm* — DLA Piper LLP (US)

(57) ABSTRACT

A memory device includes a memory cell, a logic device and a high voltage device formed on the same semiconductor substrate. Portions of the upper surface of the substrate under the memory cell and the high voltage device are recessed relative to the upper surface portion of the substrate under the logic device. The memory cell includes a polysilicon floating gate disposed over a first portion of a channel region of the substrate, a polysilicon word line gate disposed over a second portion of the channel region, a polysilicon erase gate disposed over a source region of the substrate, and a metal control gate disposed over the floating gate and insulated from the floating gate by a composite insulation layer that includes a high-K dielectric. The logic device includes a metal gate disposed over the substrate. The high voltage device includes a polysilicon gate disposed over the substrate.

21 Claims, 15 Drawing Sheets

(51) Int. Cl.
*H01L 29/49* (2006.01)
*H01L 27/11529* (2017.01)
*H01L 27/11546* (2017.01)
*H01L 27/11524* (2017.01)
*H01L 27/11534* (2017.01)
*H01L 21/28* (2006.01)

(52) U.S. Cl.
CPC .. *H01L 27/11529* (2013.01); *H01L 27/11534* (2013.01); *H01L 27/11546* (2013.01); *H01L 29/40114* (2019.08); *H01L 29/4916* (2013.01); *H01L 29/7881* (2013.01)

(58) Field of Classification Search
CPC ......... H01L 27/11546; H01L 29/40114; H01L 29/42328; H01L 29/4916; H01L 29/66825; H01L 29/788; H01L 29/7881
See application file for complete search history.

(56) References Cited

U.S. PATENT DOCUMENTS

| | | | |
|---|---|---|---|
| 6,861,698 B2 | 3/2005 | Wang | |
| 7,046,552 B2 * | 5/2006 | Chen | G11C 16/0425 257/314 |
| 7,119,396 B2 | 10/2006 | Chen | |
| 7,151,042 B2 | 12/2006 | Jeng et al. | |
| 7,315,056 B2 | 1/2008 | Klinger et al. | |
| 7,326,614 B2 | 2/2008 | Kianian et al. | |
| 7,439,133 B2 | 10/2008 | Chou | |
| 7,834,390 B2 | 11/2010 | Nagai | |
| 7,868,375 B2 | 1/2011 | Liu et al. | |
| 7,927,994 B1 | 4/2011 | Liu et al. | |
| 8,008,702 B2 | 8/2011 | Wang et al. | |
| 8,101,477 B1 | 1/2012 | Power | |
| 8,138,524 B2 | 3/2012 | Kotov et al. | |
| 8,173,514 B2 | 5/2012 | Ogura | |
| 8,334,560 B2 | 12/2012 | Pan | |
| 8,664,059 B2 | 3/2014 | Dornel et al. | |
| 8,669,607 B1 | 3/2014 | Tsair | |
| 8,878,281 B2 | 11/2014 | Huang | |
| 9,082,865 B2 | 7/2015 | Yu | |
| 9,093,546 B2 | 7/2015 | Uozaki et al. | |
| 9,123,822 B2 | 9/2015 | Yoo et al. | |
| 9,219,134 B2 | 12/2015 | Fukumoto | |
| 9,230,977 B2 | 1/2016 | Wu | |
| 9,276,005 B1 | 3/2016 | Zhou | |
| 9,276,006 B1 | 3/2016 | Chen et al. | |
| 9,287,282 B2 | 3/2016 | Hsieh | |
| 9,349,741 B2 | 5/2016 | Liu et al. | |
| 9,368,605 B2 | 6/2016 | Lusetzky | |
| 9,379,121 B1 | 6/2016 | Chen et al. | |
| 9,431,257 B2 | 8/2016 | Liu et al. | |
| 9,431,407 B2 | 8/2016 | Su et al. | |
| 9,472,562 B1 | 10/2016 | Liu et al. | |
| 9,484,261 B2 | 11/2016 | Su et al. | |
| 9,496,369 B2 | 11/2016 | Wu et al. | |
| 9,634,019 B1 | 4/2017 | Zhou et al. | |
| 9,793,280 B2 | 10/2017 | Chen et al. | |
| 9,793,281 B2 | 10/2017 | Su et al. | |
| 10,535,671 B2 * | 1/2020 | Liu | H01L 27/11548 |
| 2005/0186741 A1 | 8/2005 | Roizin | |
| 2009/0039410 A1 | 2/2009 | Liu | |
| 2009/0065873 A1 | 3/2009 | Park | |
| 2009/0166708 A1 | 7/2009 | Io | |
| 2009/0215243 A1 | 8/2009 | Ogura | |
| 2009/0239351 A1 * | 9/2009 | Aloni | H01L 27/0733 438/396 |
| 2009/0321810 A1 | 12/2009 | Ryu et al. | |
| 2010/0054043 A1 | 3/2010 | Liu | |
| 2010/0207174 A1 | 8/2010 | Tsai | |
| 2011/0049603 A1 | 3/2011 | Pan | |
| 2012/0299056 A1 | 11/2012 | Arai | |
| 2013/0032872 A1 | 2/2013 | Kotov et al. | |
| 2013/0171814 A1 | 7/2013 | Torii | |
| 2013/0207174 A1 | 8/2013 | Wang | |
| 2013/0242659 A1 | 9/2013 | Yu | |
| 2013/0313626 A1 | 11/2013 | Huang | |
| 2014/0015030 A1 * | 1/2014 | Han | H01L 29/788 257/316 |
| 2014/0097482 A1 | 4/2014 | Tokunaga et al. | |
| 2014/0264538 A1 | 9/2014 | Yu | |
| 2015/0072489 A1 | 3/2015 | Baker, Jr. | |
| 2015/0084111 A1 | 3/2015 | Wu | |
| 2015/0137207 A1 | 5/2015 | Chuang | |
| 2015/0171101 A1 | 6/2015 | Ishida | |
| 2015/0171102 A1 | 6/2015 | Ishida | |
| 2015/0171103 A1 | 6/2015 | Ishida | |
| 2015/0214237 A1 | 7/2015 | Hsieh | |
| 2015/0263010 A1 * | 9/2015 | Chuang | H01L 29/66545 257/319 |
| 2016/0020219 A1 * | 1/2016 | Chuang | H01L 27/11573 257/324 |
| 2016/0043095 A1 | 2/2016 | Yang | |
| 2016/0126327 A1 | 5/2016 | Chen | |
| 2016/0148944 A1 | 5/2016 | Yu | |
| 2016/0163722 A1 | 6/2016 | Chang | |
| 2016/0181266 A1 * | 6/2016 | Chuang | H01L 27/11541 257/316 |
| 2016/0218110 A1 | 7/2016 | Yang | |
| 2017/0117372 A1 * | 4/2017 | Li | H01L 29/42328 |
| 2017/0125603 A1 | 5/2017 | Zhou | |
| 2018/0151580 A1 * | 5/2018 | Wu | H01L 29/4236 |
| 2018/0315765 A1 * | 11/2018 | Lin | H01L 21/76232 |
| 2020/0020601 A1 * | 1/2020 | Lin | H01L 22/34 |

OTHER PUBLICATIONS

Blomme, et al., "Hybrid Floating Gate Cell for Sub-20-nm NAND Flash Memory Technology," IEEE Electron Device Letters, vol. 33, No. 3, pp. 333-335, Mar. 2012.

Jayanti, et al., "Investigation of Thermal Stability of High-k Interpoly Dielectrics in TaN Metal Floating Gate Memory Structures," Dept. of Electrical and Computer Engineering, North Carolina State University, email sjayant2@ncsu.edu, 4 pages.

Raghunathan, et al., "Investigation of Ballistic Current in Scaled Floating-gate NAND Flash and a Solution," Dept. of Electrical Engineering, Stanford University, Intel Corporation, email rshyam@stanford.edu, 4 pages.

Breuil, et al., "Optimization of Ru Based Hybrid Floating Gate for Planar NAND Flash," IEEE, pp. 101-104, 2015.

* cited by examiner

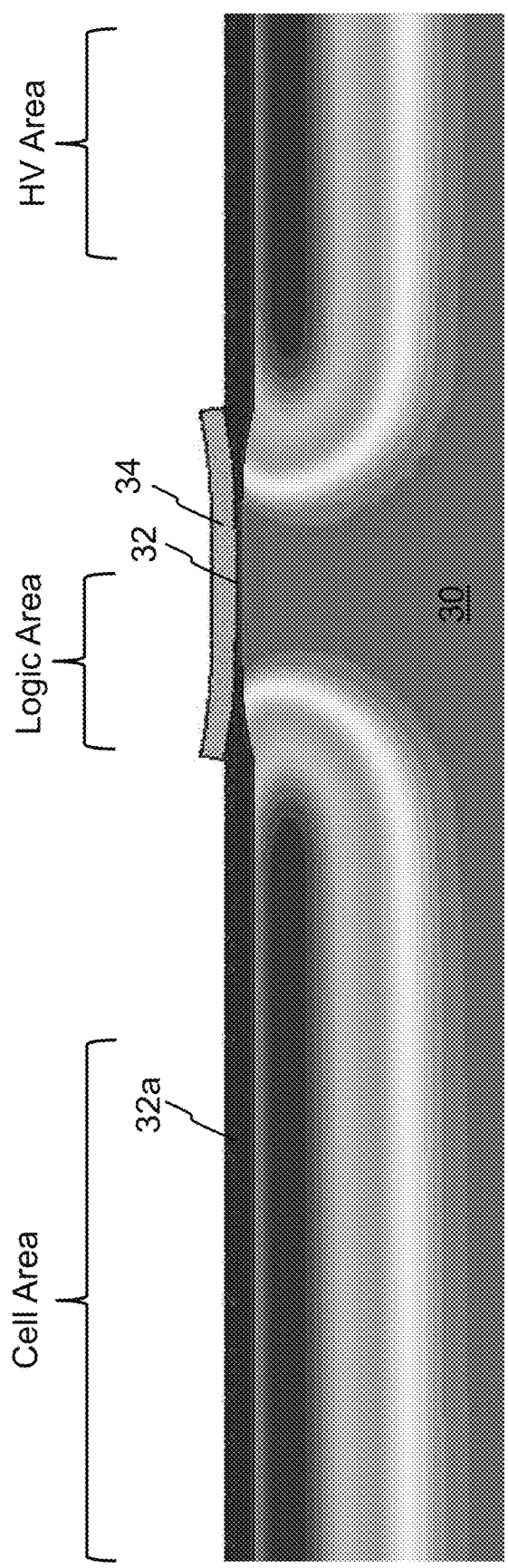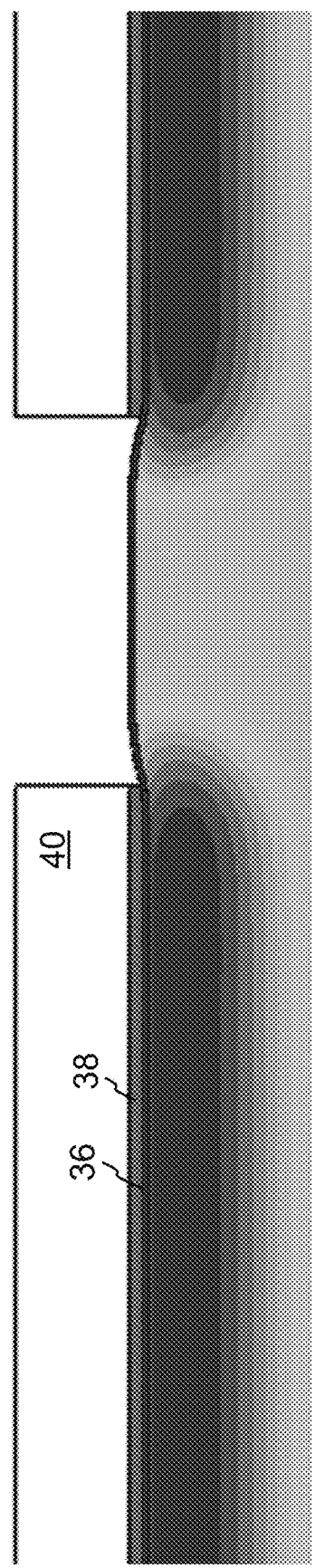
Fig. 3
Fig. 4

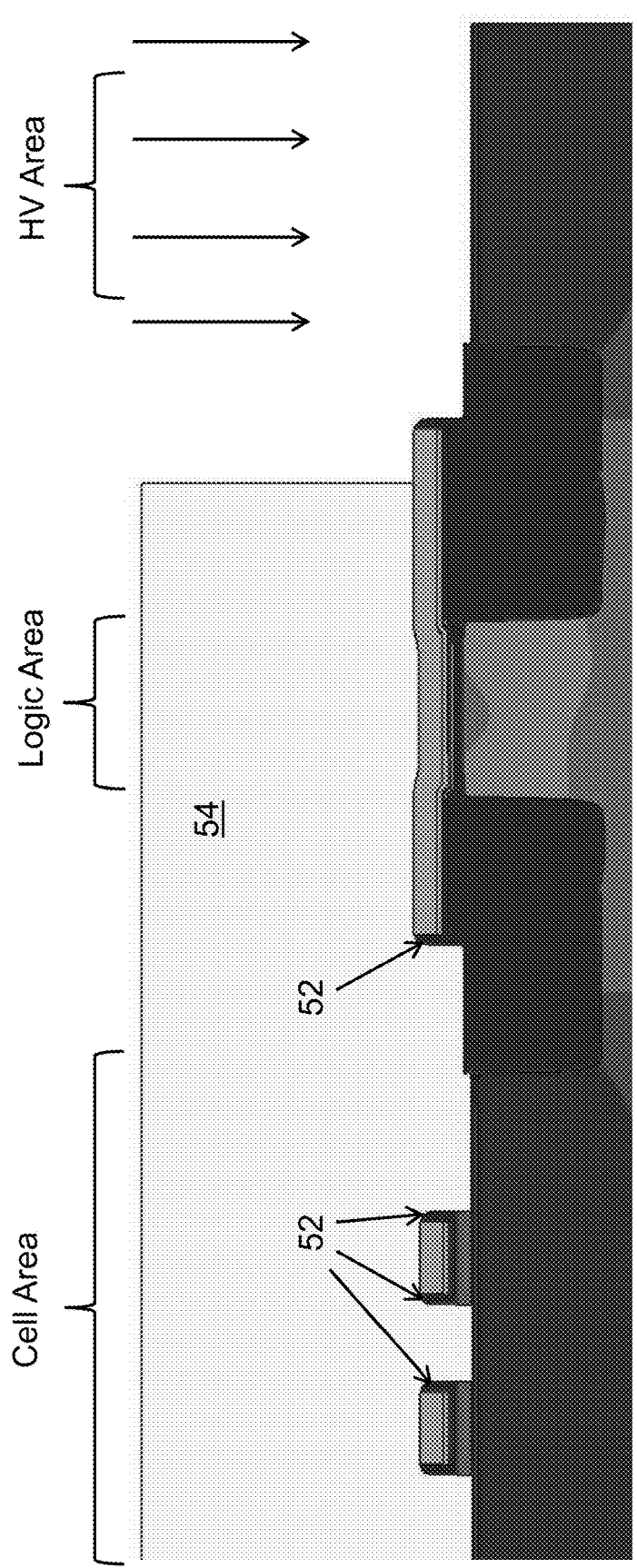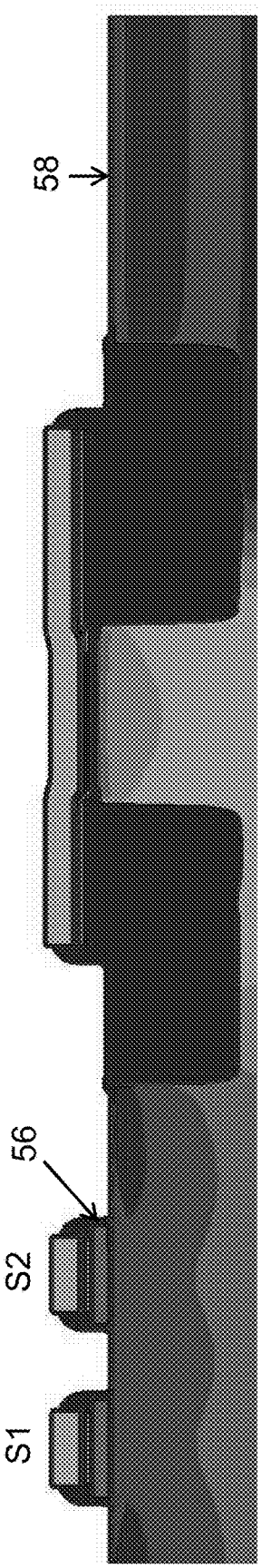
Fig. 7
Fig. 8

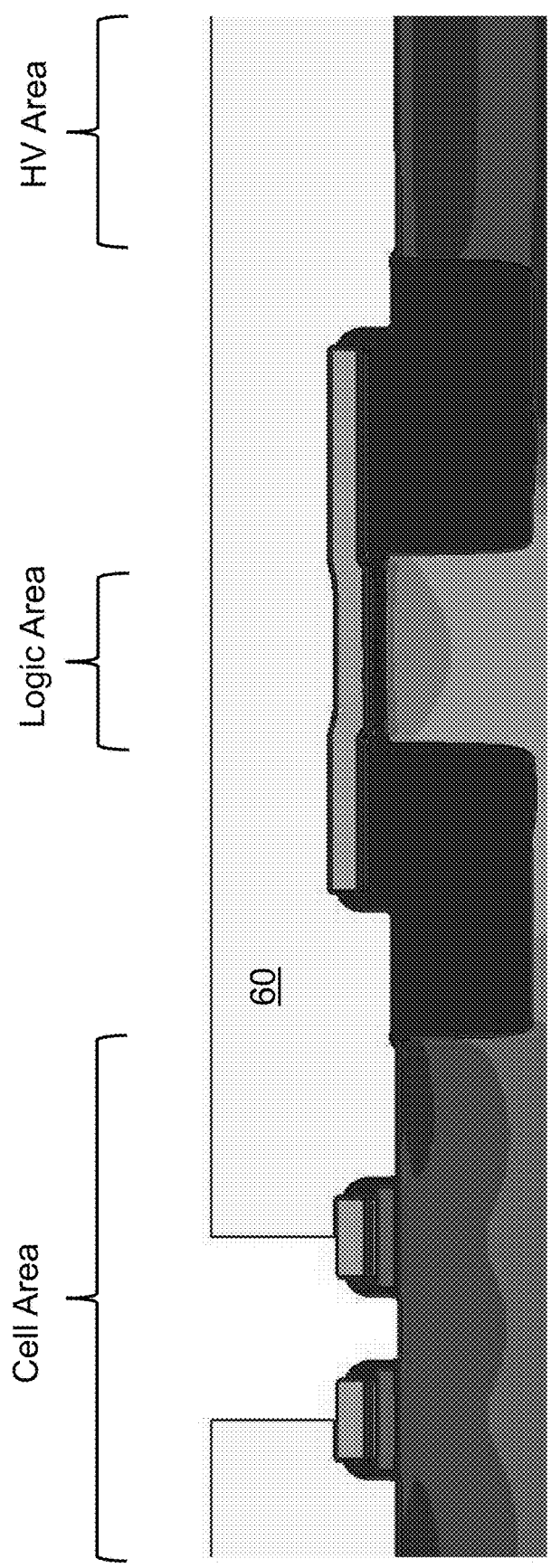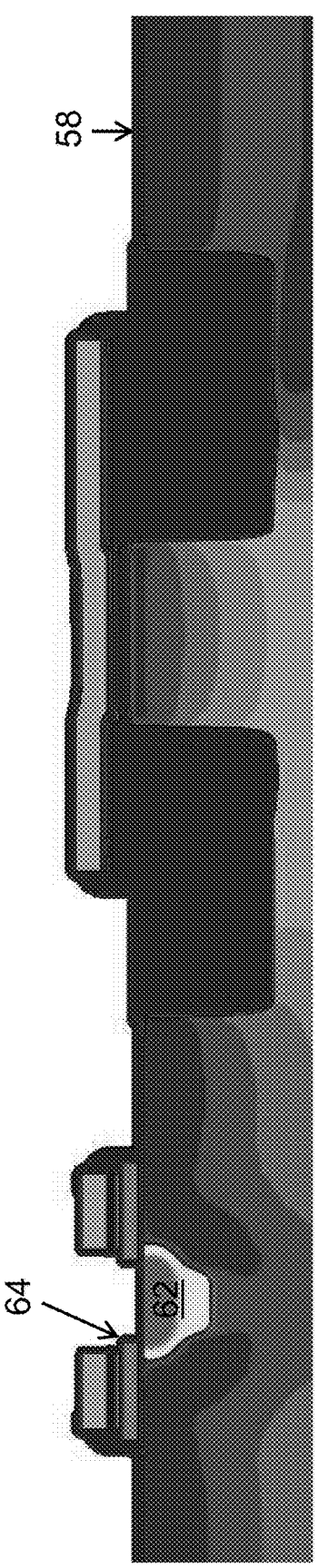
Fig. 9
Fig. 10

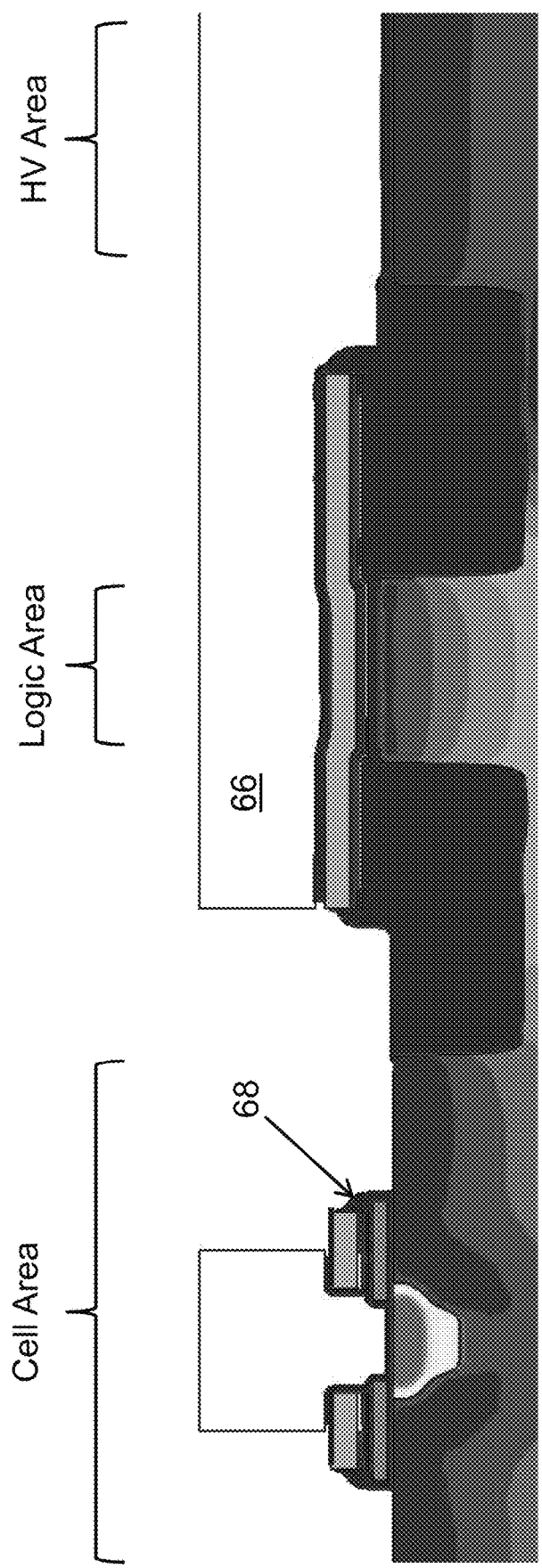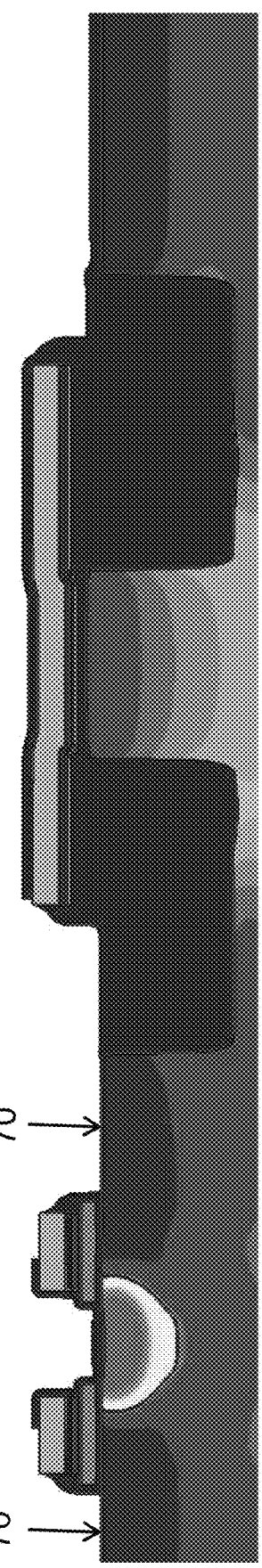
Fig. 11
Fig. 12

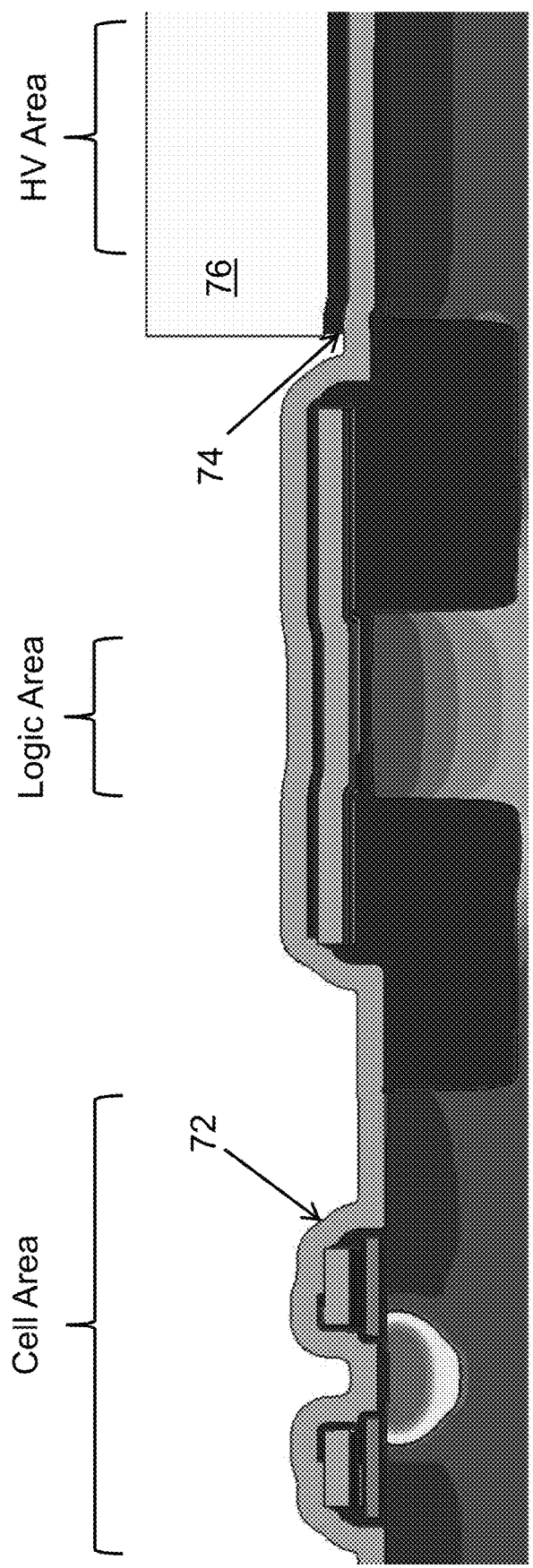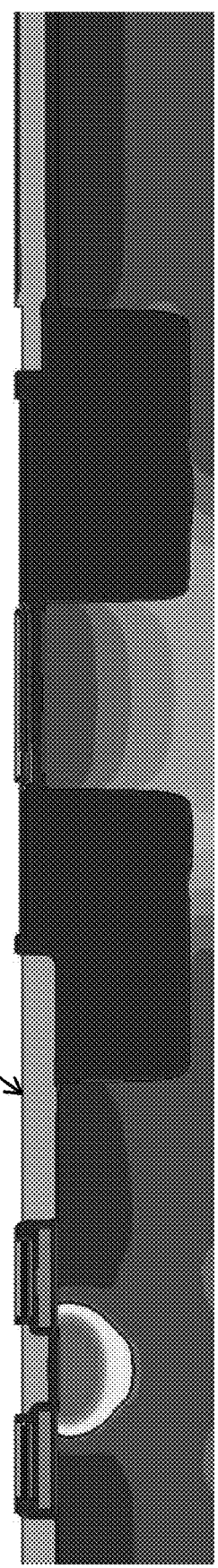
Fig. 13
Fig. 14

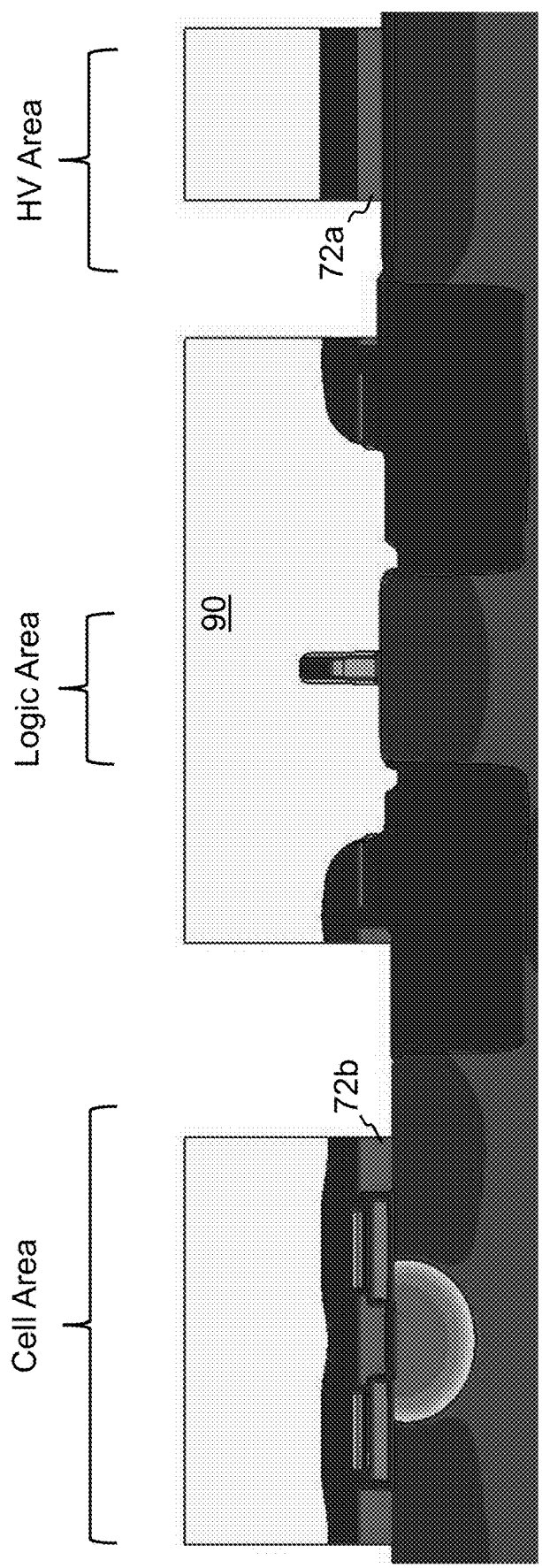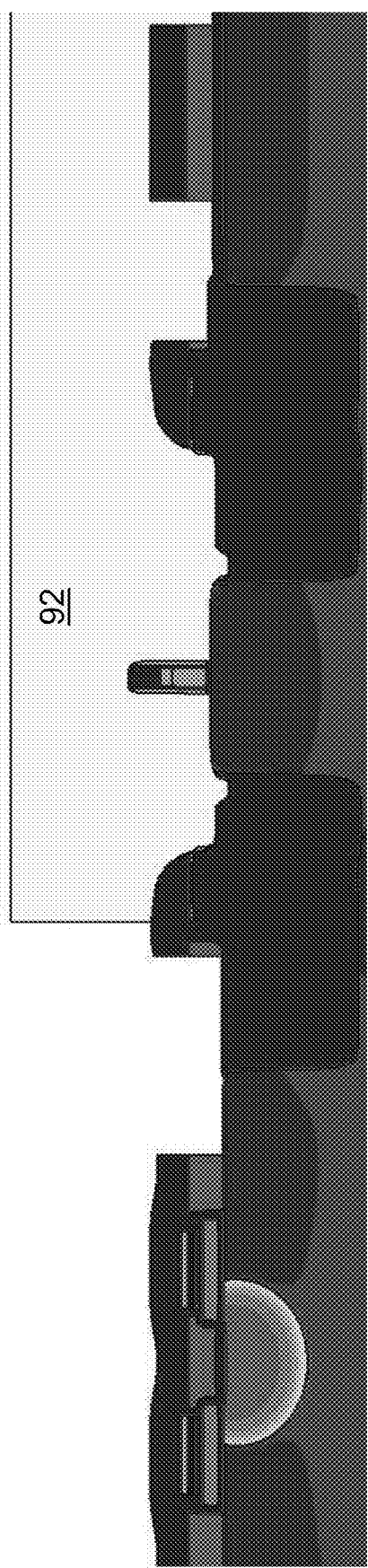

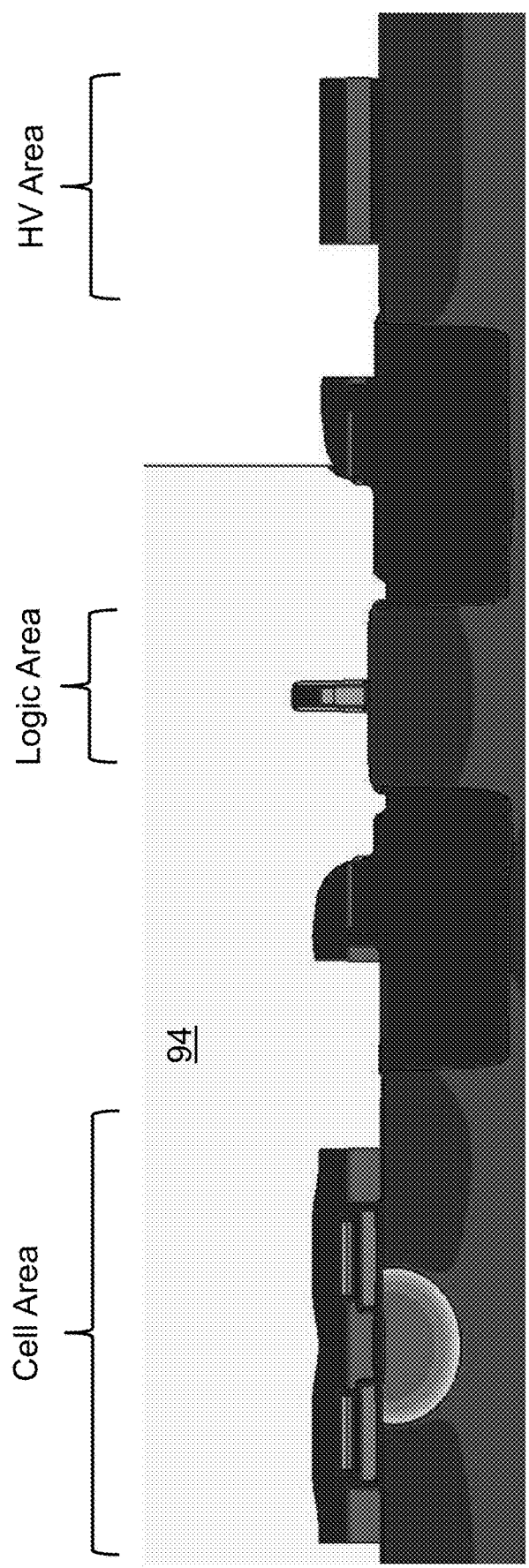
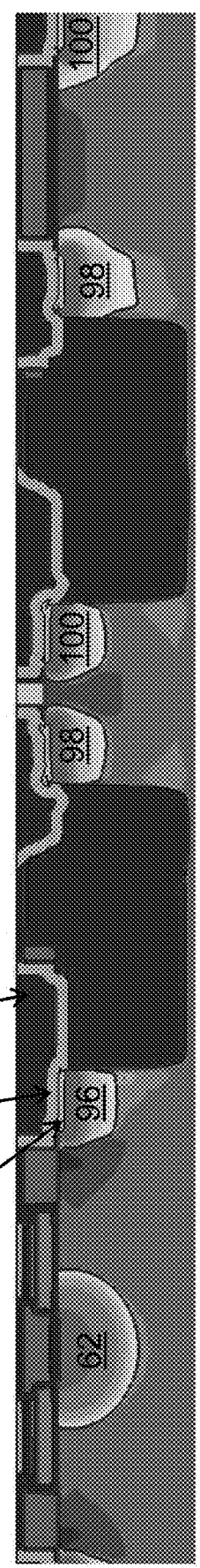
Fig. 19
Fig. 20

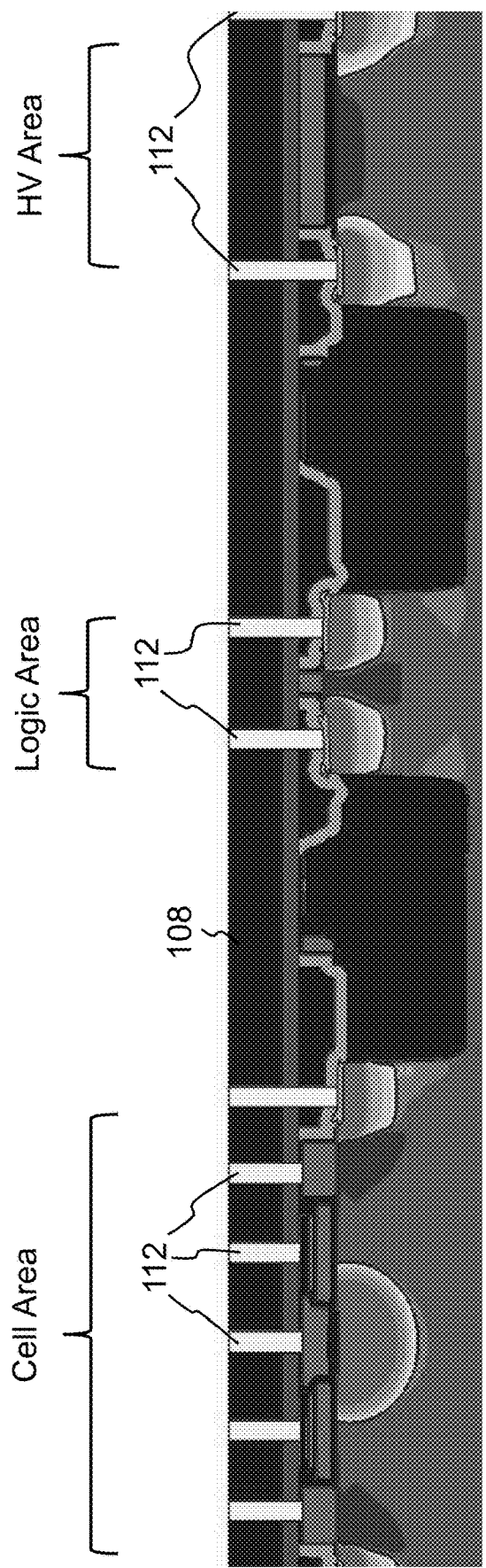
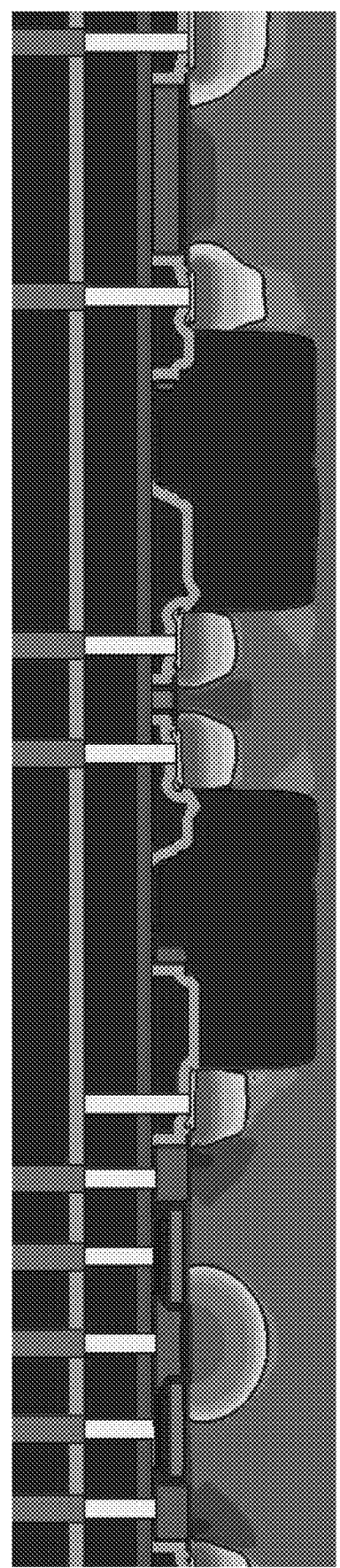
Fig. 23
Fig. 24

NON-VOLATILE SPLIT GATE MEMORY CELLS WITH INTEGRATED HIGH K METAL CONTROL GATES AND METHOD OF MAKING SAME

RELATED APPLICATIONS

This application claims the benefit of U.S. Provisional Application No. 62/594,976, filed Dec. 5, 2017, and which is incorporated herein by reference.

FIELD OF THE INVENTION

The present invention relates to non-volatile memory devices.

BACKGROUND OF THE INVENTION

Split gate non-volatile memory devices are well known in the art. For example, U.S. Pat. No. 7,927,994 discloses a split gate non-volatile memory cell. FIG. 1 illustrates an example of such a split gate memory cell formed on a semiconductor substrate 12. Source and drain regions 16 and 14 are formed as diffusion regions in substrate 12, and define a channel region 18 there between. The memory cell includes four conductive gates: a floating gate 22 disposed over and insulated from a first portion of the channel region 18 and a portion of the source region 16, a control gate 26 disposed over and insulated from the floating gate 22, an erase gate 24 disposed over and insulated from the source region 16, and a select gate 20 disposed over and insulated from a second portion of the channel region 18. A conductive contact 10 can be formed to electrically connect to the drain region 14. U.S. Pat. No. 7,315,056 discloses another split gate non-volatile memory cell, which is similar to that of U.S. Pat. No. 7,927,994, but without a control gate. FIG. 2 illustrates the memory cells of the '056 patent (with similar elements indicated with the same element number).

The memory cells are arranged in an array to form a device, with columns of such memory cells separated by columns of isolation regions. Isolation regions are portions of the substrate in which insulation material is formed. Logic (core) devices and high voltage devices can be formed on the same chip as the memory array, often formed sharing some of the same processing steps. Those dedicated areas of the substrate in which logic device and high voltage devices are formed will be referred to herein as the logic and high voltage areas, respectively.

One issue with conventional split gate memory cells is the height of the memory cells on the substrate is greater than that of the devices in the logic and high voltage areas. Yet, it can be challenging to reduce the height of the memory cells while still preserving desired performance. The present invention is a novel technique for forming a split gate non-volatile memory device on the same chip as logic and high voltage devices, with the memory cells utilizing control gates having a metal material with conventional ONO (oxide/nitride/oxide) or OHKO (oxide/HK/oxide) under the control gate as the coupling dielectrics to the floating gate.

BRIEF SUMMARY OF THE INVENTION

The aforementioned problems and needs are addressed by a method of making a memory device on a semiconductor substrate having an upper surface and first, second and third areas, includes recessing portions of the upper surface in the first and third areas relative to a portion of the upper surface in the second area, forming a memory cell, forming a logic device and forming a high voltage device. The forming of the memory cell includes forming a first source region and a first drain region in the substrate under the recessed portion of the upper surface in the first area of the substrate, with a first channel region of the substrate extending between the first source region and the first drain region, forming a polysilicon floating gate disposed over and insulated from a first portion of the first channel region, forming a polysilicon word line gate disposed over and insulated from a second portion of the first channel region, forming a polysilicon erase gate disposed over and insulated from the first source region, and forming a metal control gate disposed over and insulated from the floating gate. The forming of the logic device includes forming a second source region and a second drain region in the second area of the substrate, with a second channel region of the substrate extending between the second source region and the second drain region, and forming a metal gate disposed over and insulated from the second channel region. The forming of the high voltage device includes forming a third source region and a third drain region in the substrate under the recessed portion of the upper surface in the third area of the substrate, with a third channel region of the substrate extending between the third source region and the third drain region, and forming a polysilicon gate disposed over and insulated from the third channel region.

A memory device includes a semiconductor substrate having an upper surface and first, second and third areas, wherein portions of the upper surface in the first and third areas are recessed relative to a portion of the upper surface in the second area, a memory cell, a logic device and a high voltage device. The memory cell includes a first source region and a first drain region formed in the substrate under the recessed portion of the upper surface in the first area of the substrate, with a first channel region of the substrate extending between the first source region and the first drain region, a polysilicon floating gate disposed over and insulated from a first portion of the first channel region, a polysilicon word line gate disposed over and insulated from a second portion of the first channel region, a polysilicon erase gate disposed over and insulated from the first source region, and a metal control gate disposed over and insulated from the floating gate. The logic device includes a second source region and a second drain region formed in the second area of the substrate, with a second channel region of the substrate extending between the second source region and the second drain region, and a metal gate disposed over and insulated from the second channel region. The high voltage device includes a third source region and a third drain region formed in the substrate under the recessed portion of the upper surface in the third area of the substrate, with a third channel region of the substrate extending between the third source region and the third drain region, and a polysilicon gate disposed over and insulated from the third channel region.

Other objects and features of the present invention will become apparent by a review of the specification, claims and appended figures.

BRIEF DESCRIPTION OF THE DRAWINGS

FIGS. 3-26 are side cross sectional views illustrating the steps in forming non-volatile memory cells, logic devices and high voltage devices on a substrate.

DETAILED DESCRIPTION OF THE INVENTION

Figure 1:
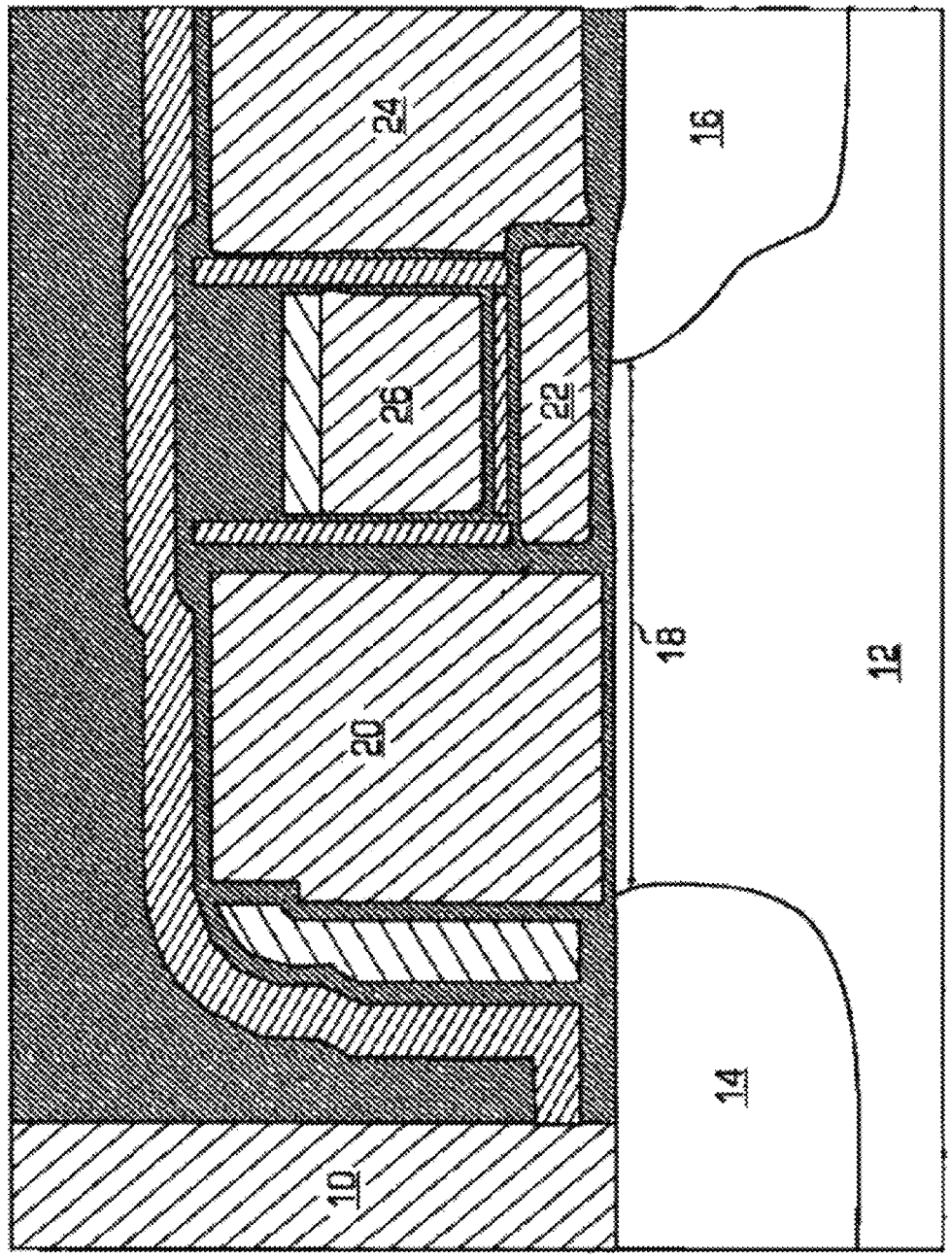
FIG. 1 is a side cross section view of a conventional memory cell.
Figure 2:
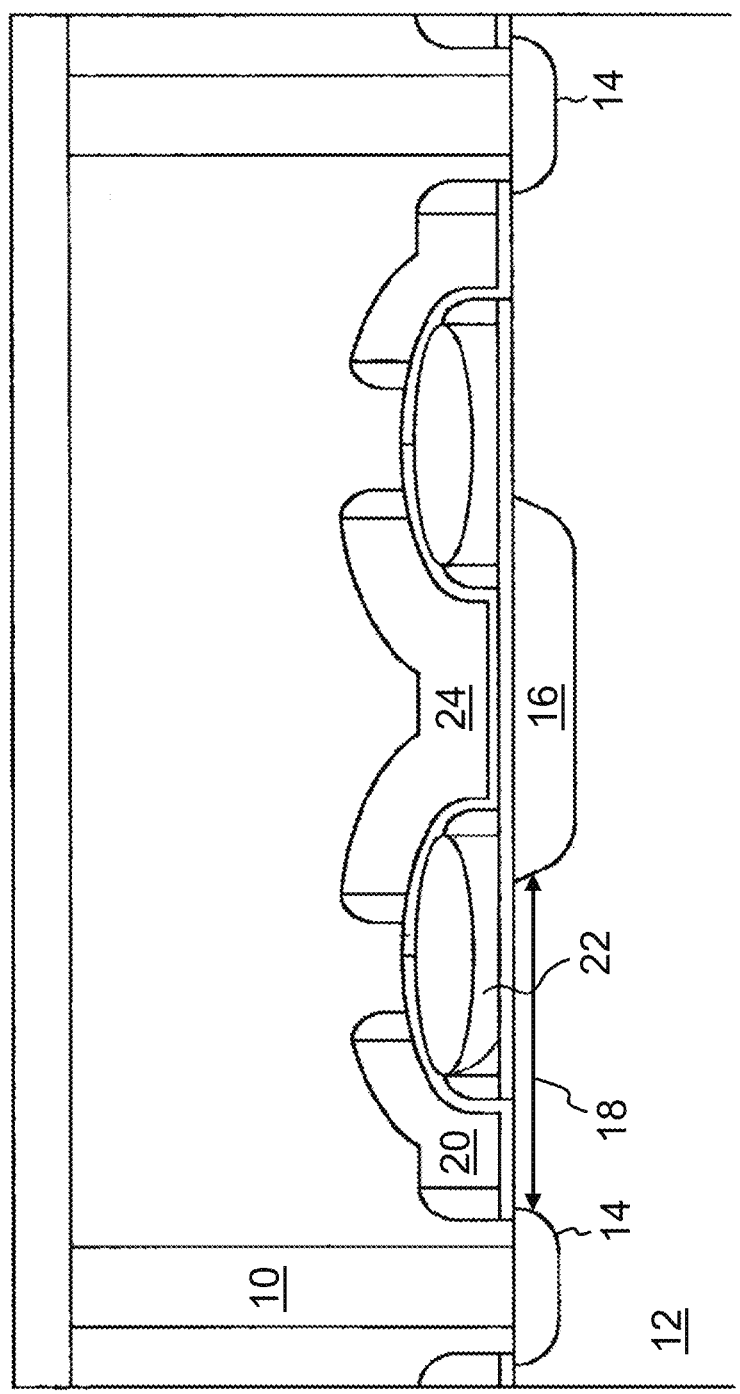
FIG. 2 is a side cross section view of a conventional memory cell.

The present invention solves the above mentioned problems by forming the control gates using a metal material or a polysilicon material and high K dielectric, and recessing the height of the substrate upper surface portion on which the memory cells are formed, as well as other techniques described herein. Referring to FIG. 3, the method begins with a semiconductor substrate 30, which is preferably of P type and is well known in the art. The substrate has three areas: the cell area in which memory cells will be formed, the logic area in which logic devices will be formed, and the HV area in which high voltage devices will be formed. One or a pair of such devices are shown in each area, but a plurality of each type of device will be formed simultaneously in each area.

As further shown in FIG. 3, there is shown the formation of a layer of silicon dioxide (oxide) 32 on the substrate 30. A layer of silicon nitride (nitride) 34 is formed on the oxide layer 32, which is then subjected to a masking etch process to remove the nitride layer 34 from the cell and HV areas. The masking etch process involves forming a photoresist material on the nitride layer 34, and exposing selected portions of the photoresist material. The photoresist is developed in which portions thereof are removed (i.e., those portions in the cell and HV areas, leaving the nitride 34 exposed in those areas). A nitride etch is then used to remove the exposed portions of the nitride 34, leaving the nitride 34 in the logic area. After photoresist removal, a thermal oxidation process is then used to oxidize and consume silicon by forming a thick layer of oxide in the cell and HV areas (i.e., creates a thickened oxide 32a), which recesses the upper surface of the silicon substrate 30 in those areas relative to the logic area which is protected by the nitride 34, as shown in FIG. 3.

Nitride and oxide etches are then performed to remove the nitride layer 34 and oxide layer 32/32a. An oxide layer 36 is formed on the substrate surface (e.g., by thermal oxidation). A polysilicon (poly) layer 38 is formed on the oxide layer 36. A masking step is used to form photoresist 40, and remove the photoresist 40 only from the logic area. A poly etch is performed to remove the exposed poly layer 38 in the logic area. The resulting structure is shown in FIG. 4.

Figure 5:
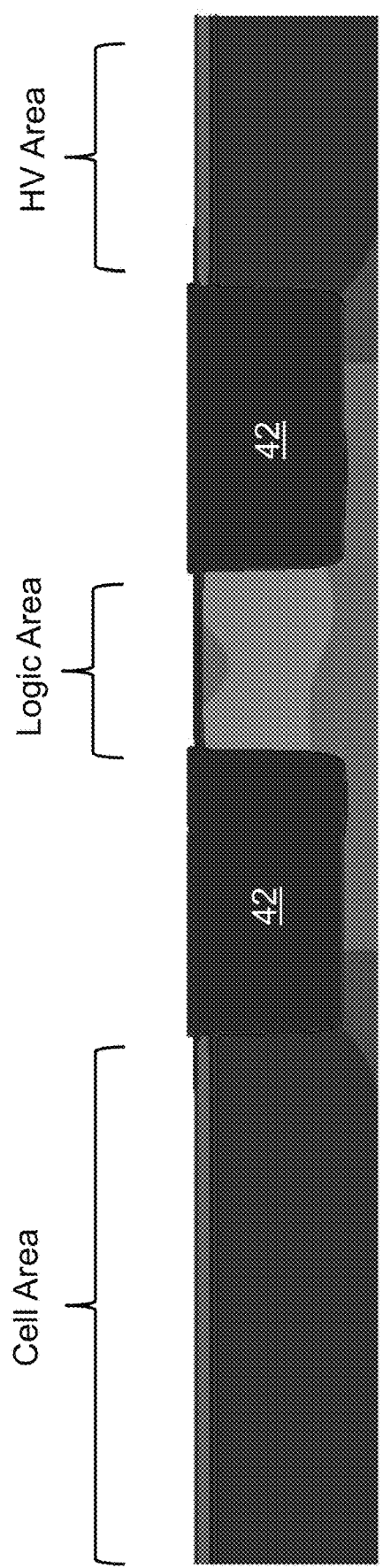
Figure 6:
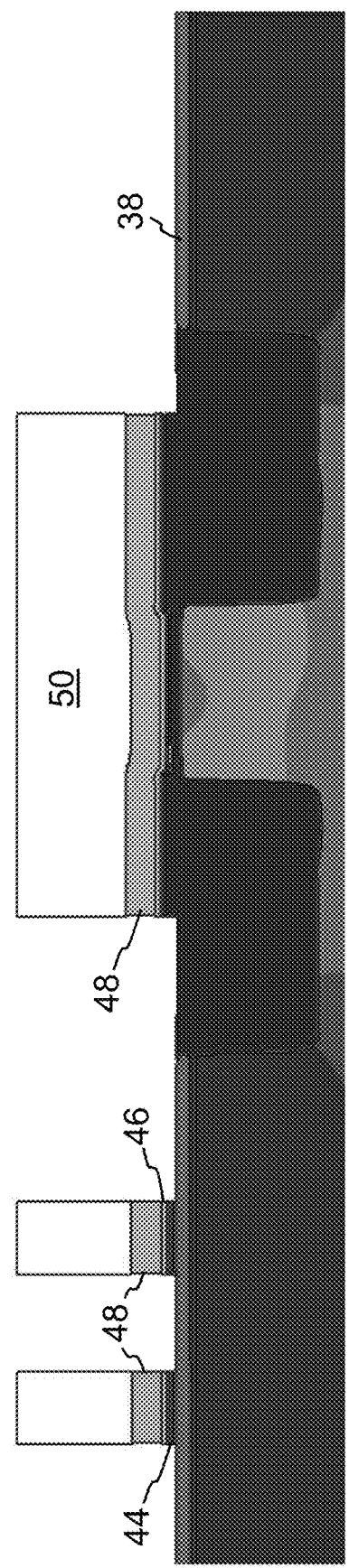

After the photoresist 40 is removed, insulation areas (e.g., preferably well-known shallow trench insulation—STI) are formed in the substrate 30 between the cell, logic and HV areas. STI is oxide formed in trenches in the substrate. STI is preferably formed by a masking and etch process that selectively etches through poly layer 38 and oxide layer 36, and into the substrate. The trenches are then filled with oxide 42, as shown in FIG. 5. A high-K dielectric layer 44 such as O/HK/O (oxide, high-K dielectric, oxide, where the high-K dielectric is an insulation material having a dielectric constant K greater than that of oxide, such as HfO2, ZrO2, TiO2, Ta2O5, or other adequate materials) is formed on the structure. A metal conductive layer 46 such as Ti/TiN is then formed on the insulation layer 44. A nitride layer 48 is formed on the metal conductive layer 46. Photoresist 50 is formed on the structure and patterned in a masking step, in which the photoresist 50 is removed in the HV area and select portions of the cell area. One or more etches are used to remove the exposed portions of nitride 48, conductive layer 46 and insulation layer 44 in the cell and HV areas, as shown in FIG. 6.

After photoresist 50 is removed, oxide spacers 52 are formed on the sidewalls of the structures by oxide deposition and etch. Alternately, spacers 52 could be formed as oxide-nitride spacers. A poly etch is used to define what will be the control gate and to remove the exposed portions of the poly layer 38 in the cell and HV areas. Photoresist 54 is formed over all areas but removed from the HV area. An implantation process is performed to implant the well region of the HV area substrate, as shown in FIG. 7. After photoresist 54 is removed, oxide spacers 56 are formed (e.g., by HTO) on the exposed end portions of the poly layer 38 and outside of oxide pacers 52 in the memory cell area, and an oxide layer 58 formed in the HV area, as shown in FIG. 8. In the memory cell area there are multiple stack structures S1 and S2 (i.e., each having nitride 48 over conductive layer 46, over insulation layer 44, over poly layer 38, over oxide 36, over substrate 30). While only one pair of stacks S1/S2 are shown, it should be understood that there is a plurality of pairs of stacks S1/S2 formed in the memory area.

Photoresist 60 is formed over the structure, and removed except for the area between stacks S1 and S2 (and portions of stacks S1/S2), as shown in FIG. 9. An implantation and thermal anneal is performed in the substrate between the stacks S1 and S2 to form source region 62. An oxide etch is performed to remove the exposed oxide between the stacks S1 and S2, which exposes the ends of the poly layer 38. After photoresist 60 is removed, an oxide deposition is performed (e.g., HTO) to form a tunnel oxide layer 64 on the exposed ends of the poly layer 38 in the cell area, and to thicken oxide 58 in the HV area, as shown in FIG. 10. An oxide deposition and etch are performed to form spacers of oxide 68 on the outer sides of stacks S1/S2. Photoresist 66 is formed on the structure and removed from the portions of the cell area outside of the stacks S1/S2, as shown in FIG. 11. After photoresist removal, a thin layer of oxide 70 is formed on the substrate adjacent the outer sides of stacks S1/S2, as shown in FIG. 12.

Figure 15:
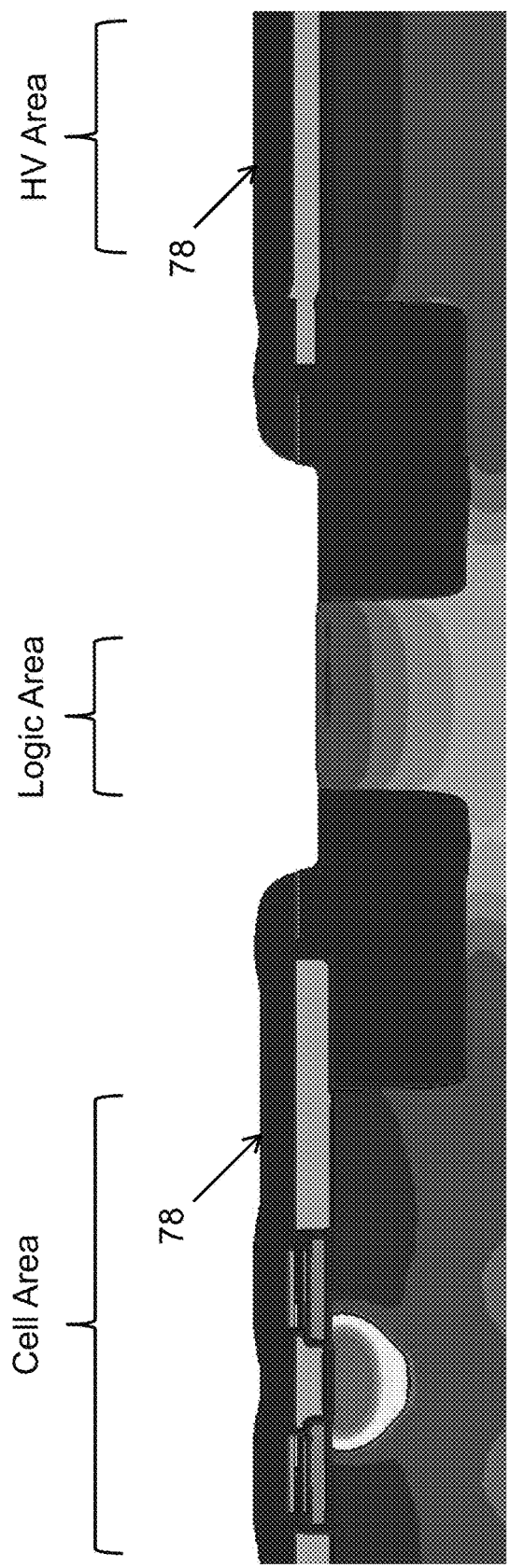

A layer of polysilicon 72 is then deposited on the structure. An oxide layer 74 is formed on the poly layer 72. Photoresist 76 is formed on the structure, and removed from the cell and logic areas. An oxide etch is used to remove the oxide layer 74 from the cell and logic areas, as shown in FIG. 13. After photoresist 76 is removed, dummy polysilicon is deposited over the structure. A CMP (chemical mechanical polish) is used to remove upper portions of the polysilicon and planarize the structure, and a further poly etch back is performed to slightly recess the polysilicon upper surface in the cell area, as shown in FIG. 14. Oxide 74 protects the poly layer 72 from this poly etch in the HV area. An oxide layer 78 is then formed on the structure, followed by a photolithographic masking step (photo and etch) to open the logic area for etches to remove the oxide, nitride, Ti/TiN and O/HK/O layers from the logic area, as shown in FIG. 15 (after photoresist removal).

Figure 16:
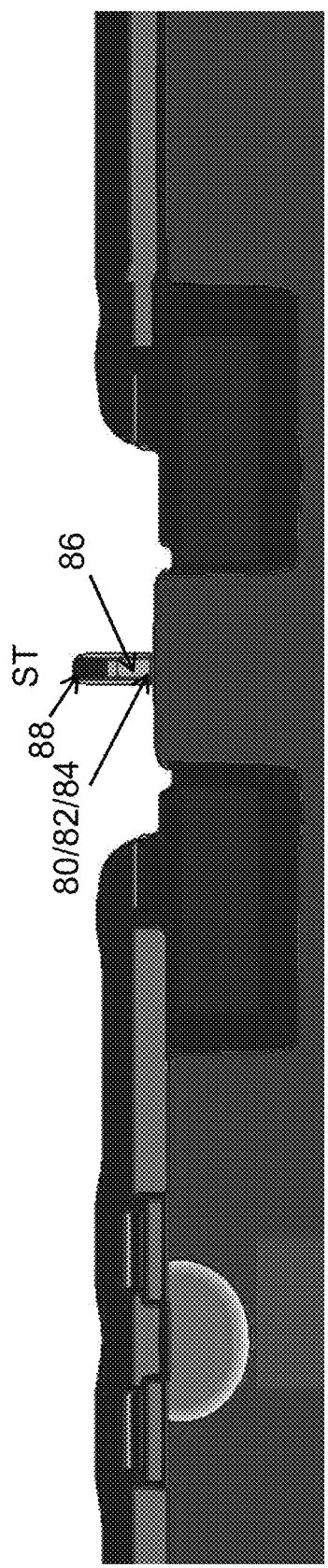

After a logic well implant in the logic area, a thin oxide layer 80 (interfacial layer—IL) is formed on the substrate in the logic area. This is followed by a high K metal gate layer HKMG formation, which comprises an insulation layer 82 of a high K material (i.e. having a dielectric constant K greater than that of oxide, such as HfO2, ZrO2, TiO2, Ta2O5, or other adequate materials, etc.), and a metal layer 84 such as TiN. A dummy poly layer 86 is then formed on the metal layer 84. One or more insulating layers 88 are formed on the dummy poly layer 86 which will be used as a hard mask. A photolithography masking step is performed to remove portions of the newly formed layers in the logic area, except stacks ST thereof, as shown in FIG. 16.

Photoresist 90 is formed on the structure, and certain portions thereof removed by a masking step (i.e., portions in the cell and HV areas). Etches are performed to remove the underlying layers down to either the substrate or an oxide on the substrate, to define the poly gates 72a in the HV area, and the word line gates 72b in the cell area, as shown in FIG. 17. After photoresist removal, photoresist 92 is formed on the structure, and selectively removed from the cell area, as shown in FIG. 18. An implantation (memory cell LDD (lightly doped drain) implant) is performed for the substrate regions adjacent the word line gates 72b. After photoresist 92 removal, photoresist 94 is formed on the structure, and selective removed from the HV area. An LDD implantation is performed for the substrate regions in the HV area, as shown in FIG. 19. After photoresist 94 removal, a layer of SiGe 95 is formed on the exposed portions of the substrate, followed by the formation of spacers on the sides of the structures. An implantation (and anneal) is then used to form drain regions 96 in the exposed areas of the substrate in the cell area, as well as source regions 98 and drain regions 100 in the logic and HV areas. A NiSi layer 102 is formed on the structure, followed by forming a thick layer 104 of insulation (e.g., ILD). CMP is then used to planarize the upper surfaces of the structure, as shown in FIG. 20.

Figure 21:
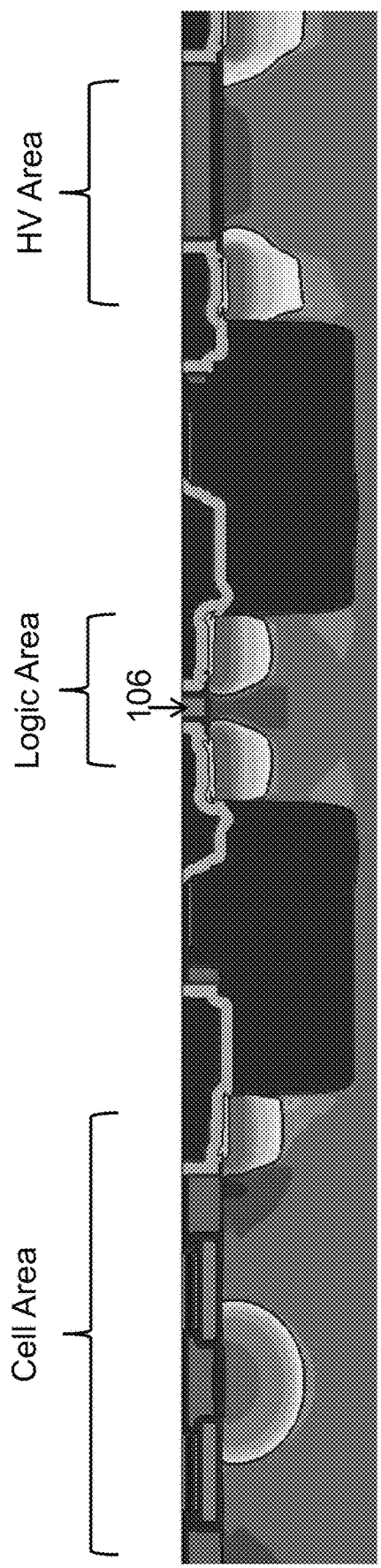
Figure 22:
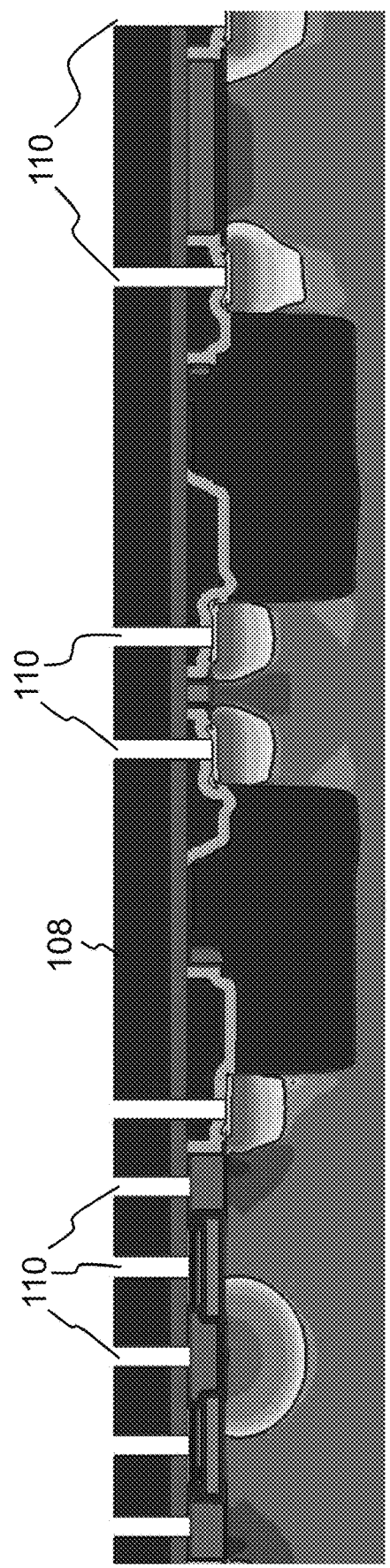

A poly etch is used to remove the dummy poly 86 from the logic area, which was left exposed by the CMP. A metal deposition and CMP are then performed to form a metal block 106 over the TiN layer 84 and high K material layer 82 in the logic area, as shown in FIG. 21. ILD insulation 108 is formed over the structure. This is followed by a masking step and ILD etch to form contact holes 110 that extend down to and expose the various source/drain regions, as well as the control gates, the word line gates and the erase gates in the cell area, as shown in FIG. 22. A metal deposition (e.g., W) and CMP are used to fill the contact holes with metal contacts 112, as shown in FIG. 23. Additional insulation, contact formation and metal contact formation can be performed to extend the metal contacts vertically, as shown in FIG. 24.

Figure 25:
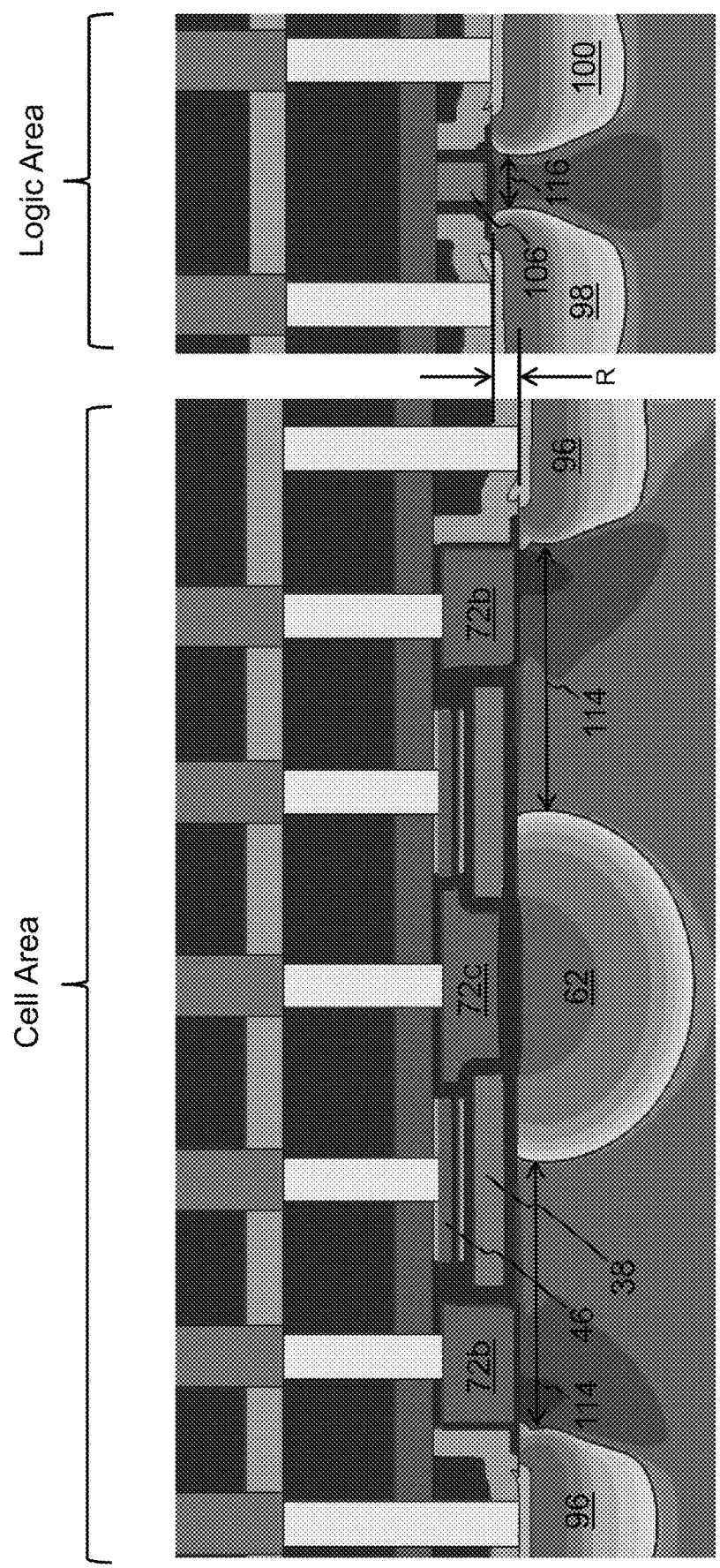
Figure 26:
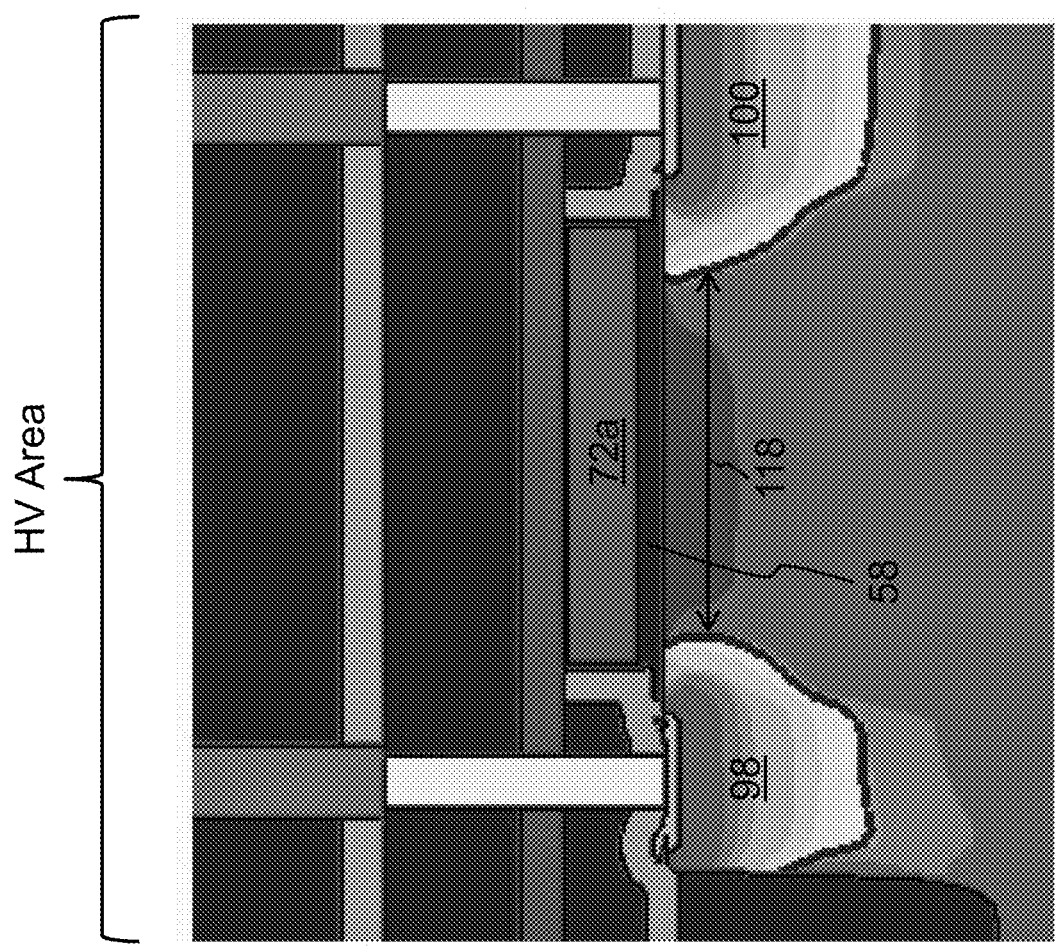

The final structure is shown in FIGS. 25 and 26. The cell area is shown in FIG. 25, and includes pairs of memory cells. Each memory cell pair includes a source region 62 and two spaced apart drain regions 96 defining channel regions 114 there between. Two polysilicon floating gates 38 are each disposed over and insulated from a portion of the source region 62 and a portion of their respective channel region 114. Two polysilicon word line gates 72b are each disposed over and insulated from another portion of their respective channel region 114 (adjacent one of the drain regions 96). A polysilicon erase gate 72c is disposed over and insulated from the source region 62. Two metal control gates 46 are each disposed over and insulated from (by high K dielectric layer and oxide composite insulation layer—e.g., O/HK/O 44) one of the floating gates 38. The logic area is also shown in FIG. 25, and includes logic devices each including spaced apart source and drain regions 98/100 with a channel region 116 there between, and a high K metal gate (metal gate 106 and high K layer 82) over channel region 116. The substrate surface in the cell area is recessed by a recess amount R relative to the substrate surface in the logic area, so that the tops of the shorter logic devices in the logic area and the taller memory cells in the cell area are substantially even with each other. The HV area is shown in FIG. 26, and includes HV devices each including spaced apart source and drain regions 98/100 with a channel region 118 there between, and a polysilicon gate 72a disposed over and insulated from (by thickened oxide 58) the channel region 118. The thickened oxide 58 between the gate 72a and substrate allows for higher voltage operation. The substrate surface in the HV area is recessed by the recess amount R relative to the substrate surface in the logic area, so that the tops of the shorter logic devices in the logic area and the taller HV devices in the HV area are substantially even with each other.

The above described formation technique has many advantages, including that the number of masking steps is minimized. The cell formation is decoupled with the HKMG formation process for the logic area, eliminating any risk of contamination. The thickness of the oxide under the word line gates 72b can be independently adjusted for flexibility (e.g., the thickness of the oxide under the word line gates 72b can be less than that under the floating gate 38, which can be less than that under the HV gate 72a). The top height of the various devices are even with each other (i.e., the top surfaces of the control gates 46, metal gate 106 and HV gate 72a are co-planar), which is achieved by recessing the substrate surface in the cell and HV areas, and using metal and a high-K insulator to form the memory cell control gates.

It is to be understood that the present invention is not limited to the embodiment(s) described above and illustrated herein. For example, references to the present invention herein are not intended to limit the scope of any claim or claim term, but instead merely make reference to one or more features that may be covered by one or more claims. Materials, processes and numerical examples described above are exemplary only, and should not be deemed to limit the claims. Further, as is apparent from the claims and specification, not all method steps need be performed in the exact order illustrated or claimed, but rather in any order that allows the proper formation of the memory cells of the present invention. Single layers of material could be formed as multiple layers of such or similar materials, and vice versa. The terms "forming" and "formed" as used herein shall include material deposition, material growth, or any other technique in providing the material as disclosed or claimed. Lastly, the O/HK/O layer under the control gates could be replaced with an oxide/nitride/oxide layer (ONO).

It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between). For example, forming an element "over a substrate" can include forming the element directly on the substrate with no intermediate materials/elements there between, as well as forming the element indirectly on the substrate with one or more intermediate materials/elements there between.

What is claimed is:

1. A method of making a memory device on a semiconductor substrate having an upper surface and first, second and third areas, comprising:
 recessing portions of the upper surface in the first and third areas relative to a portion of the upper surface in the second area;
 forming a memory cell by:

forming a first source region and a first drain region in the substrate under the recessed portion of the upper surface in the first area of the substrate, with a first channel region of the substrate extending between the first source region and the first drain region, forming a polysilicon floating gate disposed vertically over and insulated from a first portion of the first channel region, forming a poly silicon word line gate disposed vertically over and insulated from a second portion of the first channel region, forming a polysilicon erase gate disposed vertically over and insulated from the first source region, and forming a metal control gate disposed vertically over and insulated from the floating gate;

forming a logic device by:

forming a second source region and a second drain region in the second area of the substrate, with a second channel region of the substrate extending between the second source region and the second drain region, and forming a metal gate disposed vertically over and insulated from the second channel region;

forming a high voltage device by:

forming a third source region and a third drain region in the substrate under the recessed portion of the upper surface in the third area of the substrate, with a third channel region of the substrate extending between the third source region and the third drain region, and forming a poly silicon gate disposed vertically over and insulated from the third channel region.

2. The method of claim 1, wherein the metal control gate is formed of Ti and TiN.

3. The method of claim 2, wherein the metal control gate is insulated from the floating gate by at least a layer of high K dielectric material.

4. The method of claim 2, wherein the metal control gate is insulated from the floating gate by a layer of high K dielectric material disposed between a pair of oxide layers.

5. The method of claim 1, wherein the metal gate is insulated from the second channel region by at least a layer of high K dielectric material.

6. The method of claim 5, wherein the metal gate is formed of TiN.

7. The method of claim 1, wherein the forming of the polysilicon word line gate, the polysilicon erase gate and the polysilicon gate comprises:

forming a layer of polysilicon over and insulated from the substrate; and selectively removing portions of the polysilicon layer in the first area leaving behind the polysilicon word line gate and the polysilicon erase gate, and in the third area leaving behind the polysilicon gate.

8. The method of claim 1, further comprising:

forming SiGe on the upper surface of the substrate over the first, second and third drain regions and over the second and third source regions.

9. The method of claim 1, wherein the recessing of the portions of the upper surface in the first and third areas comprises:

forming an insulation layer over the upper surface in the first, second and third areas;

removing the insulation layer from the first and third areas but not from the second area;

oxidizing the upper surface in the first and third areas but not in the second area.

10. The method of claim 1, wherein:

the word line gate is insulated from the substrate by a first insulation having a first thickness;

the floating gate is insulated from the substrate by a second insulation having a second thickness;

the polysilicon gate is insulated from the substrate by a third insulation having a third thickness; and the first thickness is less than the second thickness, and the second thickness is less than the third thickness.

11. The method of claim 1, wherein the forming of the first, second and third drain regions, and the second and third source regions, comprise:

performing an implantation that simultaneously forms the first drain region in the first area, the second source and the second drain regions in the second area, and the third source and the third drain regions in the third area.

12. The method of claim 1, wherein a top surface of the control gate, a top surface of the metal gate and a top surface of the polysilicon gate are co-planar.

13. A memory device, comprising:

a semiconductor substrate having an upper surface and first, second and third areas, wherein portions of the upper surface in the first and third areas are recessed relative to a portion of the upper surface in the second area;

a memory cell that includes:

a first source region and a first drain region formed in the substrate under the recessed portion of the upper surface in the first area of the substrate, with a first channel region of the substrate extending between the first source region and the first drain region, a polysilicon floating gate disposed vertically over and insulated from a first portion of the first channel region, a polysilicon word line gate disposed vertically over and insulated from a second portion of the first channel region, a polysilicon erase gate disposed vertically over and insulated from the first source region, and a metal control gate disposed vertically over and insulated from the floating gate;

a logic device that includes:

a second source region and a second drain region formed in the second area of the substrate, with a second channel region of the substrate extending between the second source region and the second drain region, and a metal gate disposed vertically over and insulated from the second channel region;

a high voltage device that includes:

a third source region and a third drain region formed in the substrate under the recessed portion of the upper surface in the third area of the substrate, with a third channel region of the substrate extending between the third source region and the third drain region, and a polysilicon gate disposed vertically over and insulated from the third channel region.

14. The device of claim 13, wherein the metal control gate is formed of Ti and TiN.

15. The device of claim 14, wherein the metal control gate is insulated from the floating gate by at least a layer of high K dielectric material.

16. The device of claim 14, wherein the metal control gate is insulated from the floating gate by a layer of high K dielectric material disposed between a pair of oxide layers.

17. The device of claim 13, wherein the metal gate is insulated from the second channel region by at least a layer of high K dielectric material.

18. The device of claim 17, wherein the metal gate is formed of TiN.

19. The device of claim 13, further comprising:
SiGe disposed directly on the upper surface of the substrate over the first, second and third drain regions and over the second and third source regions.

20. The device of claim 13, wherein:
the word line gate is insulated from the substrate by a first insulation having a first thickness;
the floating gate is insulated from the substrate by a second insulation having a second thickness;
the polysilicon gate is insulated from the substrate by a third insulation having a third thickness;
the first thickness is less than the second thickness, and the second thickness is less than the third thickness.

21. The device of claim 13, wherein a top surface of the control gate, a top surface of the metal gate and a top surface of the polysilicon gate are co-planar.

* * * * *